(12) United States Patent
Happoya (10) Patent No.: US 10,163,765 B2
(45) Date of Patent: Dec. 25, 2018

(54) SEMICONDUCTOR DEVICE THAT INCLUDES A MOLECULAR BONDING LAYER FOR BONDING OF ELEMENTS

(71) Applicant: KABUSHIKI KAISHA TOSHIBA, Tokyo (JP)

(72) Inventor: Akihiko Happoya, Ome Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/440,862

(22) Filed: Feb. 23, 2017

(65) Prior Publication Data

US 2017/0301615 A1    Oct. 19, 2017

Related U.S. Application Data

(60) Provisional application No. 62/324,702, filed on Apr. 19, 2016, provisional application No. 62/382,041, filed on Aug. 31, 2016.

(51) Int. Cl.
| | |
|---|---|
| *H01L 23/495* | (2006.01) |
| *H01L 21/56* | (2006.01) |
| *H01L 23/29* | (2006.01) |
| *H01L 23/31* | (2006.01) |
| *H01L 23/00* | (2006.01) |

(52) U.S. Cl.
CPC ........ *H01L 23/49579* (2013.01); *H01L 21/56* (2013.01); *H01L 23/293* (2013.01); *H01L 23/3114* (2013.01); *H01L 23/3128* (2013.01); *H01L 23/4952* (2013.01); *H01L 23/49555* (2013.01); *H01L 24/32* (2013.01); *H01L 24/49* (2013.01); *H01L 24/73* (2013.01); *H01L 24/83* (2013.01); *H01L 24/85* (2013.01); *H01L 24/92* (2013.01); *H01L 24/45* (2013.01); *H01L 2224/2919* (2013.01); *H01L 2224/32225* (2013.01); *H01L 2224/32245* (2013.01);
(Continued)

(58) Field of Classification Search
None
See application file for complete search history.

(56) References Cited

U.S. PATENT DOCUMENTS

| | | | | |
|---|---|---|---|---|
| 5,939,792 | A | * | 8/1999 | Ishikawa ............. H01L 23/3135 257/787 |
| 7,015,587 | B1 | * | 3/2006 | Poddar .............. H01L 23/49575 257/666 |

(Continued)

FOREIGN PATENT DOCUMENTS

| | | |
|---|---|---|
| JP | 2013179449 A | 9/2013 |
| JP | 2014045247 A | 3/2014 |
| TW | 200609263 A | 3/2006 |
| TW | 201000590 A | 1/2010 |
| TW | 201117337 A | 5/2011 |
| TW | 201125922 A | 8/2011 |
| TW | 201240029 A | 10/2012 |

*Primary Examiner* — Calvin Choi
(74) *Attorney, Agent, or Firm* — Patterson & Sheridan, LLP (57) ABSTRACT

A semiconductor device includes a semiconductor chip having a terminal thereon, a lead frame for connection to an external device, a bonding wire connecting the terminal of the semiconductor chip and the lead frame. A mold resin layer encloses the semiconductor chip and the bonding wire, such that a portion of the lead frame extends out of the mold resin layer. A molecular bonding layer has a portion on a surface of the bonding wire and includes a first molecular portion covalently bonded to a material of the bonding wire and a material of the mold resin layer.

13 Claims, 8 Drawing Sheets

(52) U.S. Cl.
CPC ............... *H01L 2224/45144* (2013.01); *H01L 2224/45147* (2013.01); *H01L 2224/4852* (2013.01); *H01L 2224/48091* (2013.01); *H01L 2224/48106* (2013.01); *H01L 2224/48227* (2013.01); *H01L 2224/48247* (2013.01); *H01L 2224/73265* (2013.01); *H01L 2224/8592* (2013.01); *H01L 2224/92247* (2013.01); *H01L 2924/01026* (2013.01); *H01L 2924/01028* (2013.01); *H01L 2924/01029* (2013.01); *H01L 2924/01042* (2013.01); *H01L 2924/01047* (2013.01); *H01L 2924/01074* (2013.01); *H01L 2924/1033* (2013.01); *H01L 2924/10253* (2013.01); *H01L 2924/10272* (2013.01); *H01L 2924/13064* (2013.01); *H01L 2924/13091* (2013.01); *H01L 2924/15311* (2013.01)

(56) References Cited

U.S. PATENT DOCUMENTS

| | | |
|---|---|---|
| 9,166,298 B2 | 10/2015 | Hashimoto et al. |
| 2007/0196664 A1 | 8/2007 | Nikaido |
| 2008/0105886 A1* | 5/2008 | Borner .................... H01L 33/60 257/98 |
| 2011/0101543 A1 | 5/2011 | Hayashi et al. |
| 2011/0104505 A1 | 5/2011 | Mori et al. |
| 2011/0171480 A1 | 7/2011 | Mori et al. |
| 2012/0153444 A1 | 6/2012 | Haga et al. |
| 2012/0205822 A1 | 8/2012 | Tanaka |
| 2013/0222196 A1 | 8/2013 | Hashimoto et al. |
| 2015/0228875 A1* | 8/2015 | Okada ................. H01L 33/0095 257/98 |

* cited by examiner

SEMICONDUCTOR DEVICE THAT INCLUDES A MOLECULAR BONDING LAYER FOR BONDING OF ELEMENTS

CROSS-REFERENCE TO RELATED APPLICATIONS

This application is based upon and claims the benefit of priority from U.S. Provisional Patent Application No. 62/324,702, filed on Apr. 19, 2016, and U.S. Provisional Patent Application No. 62/382,041, filed on Aug. 31, 2016, the entire contents of all of which are incorporated herein by reference.

FIELD

Embodiments described herein relate generally to a semiconductor device and a method of manufacturing the semiconductor device.

BACKGROUND

A semiconductor device including a bonding wire and a resin mold is known.

DETAILED DESCRIPTION

A semiconductor device according to an embodiment includes a semiconductor chip having a terminal thereon, a lead frame for connecting to an external device, and a bonding wire extending between the terminal of the semiconductor chip and the lead frame. A mold resin layer encloses the semiconductor chip and the bonding wire, such that a portion of the lead frame extends out of the mold resin layer. A molecular bonding layer has a first portion on a surface of the bonding wire and including a first molecular portion covalently bonded to a material of the bonding wire and a material of the mold resin layer.

A semiconductor device and a method of manufacturing the semiconductor device according to embodiments will be described below with reference to the drawings. In the following description, components having the same or similar functions are denoted by the same reference numerals and redundant descriptions thereof will be omitted. The drawings are schematic, and the numbers, thicknesses, widths, proportions, and the like of components may be different from those of actual components.

First Embodiment

A first embodiment will be described with reference to FIG. 1 to FIG. 5.

Figure 1:
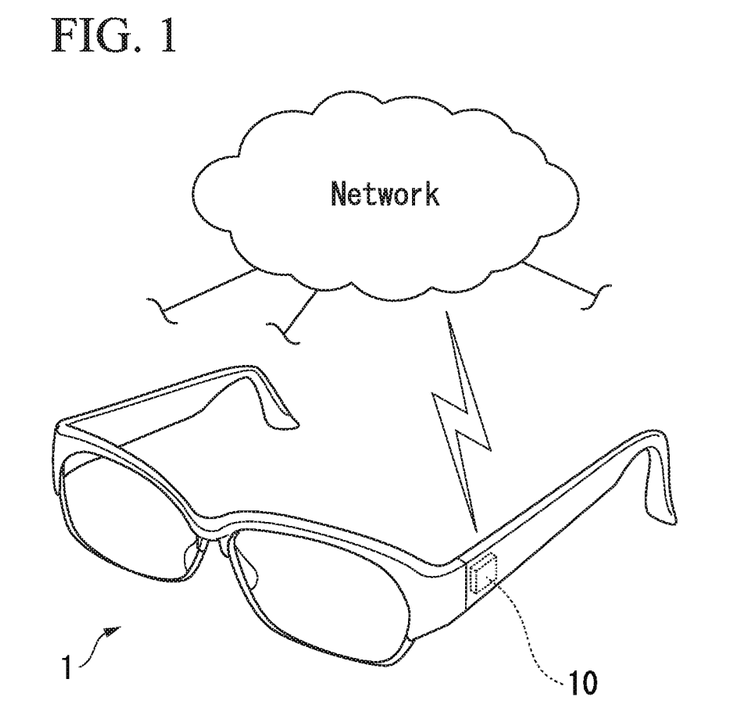
FIG. 1 is a perspective view of an electronic device according to a first embodiment.

FIG. 1 is a perspective view of an electronic device 1 according to the first embodiment. The electronic device 1 includes a semiconductor package (device) 10 according to the first embodiment. The electronic device 1 is, for example, a wearable device, but not limited thereto. The electronic device 1 is an electronic device according to, for example, Internet of Things (IoT), and can be connected to the Internet through a wireless or wired network. An example of the semiconductor package 10 includes a processor (e.g., a central processing unit), a sensor, and a wireless module. Also, the electronic device 1 and the semiconductor package 10 are not limited to the above example. The electronic device 1 may be an electronic device for a vehicle or electronic devices for other purposes. The semiconductor package 10 may be a semiconductor component that is used as a vehicle component or a power semiconductor, or may be a semiconductor component used for other purposes. In addition, the semiconductor package 10 according to second to fourth embodiments to be described below may be included in the electronic device 1.

Figure 2:
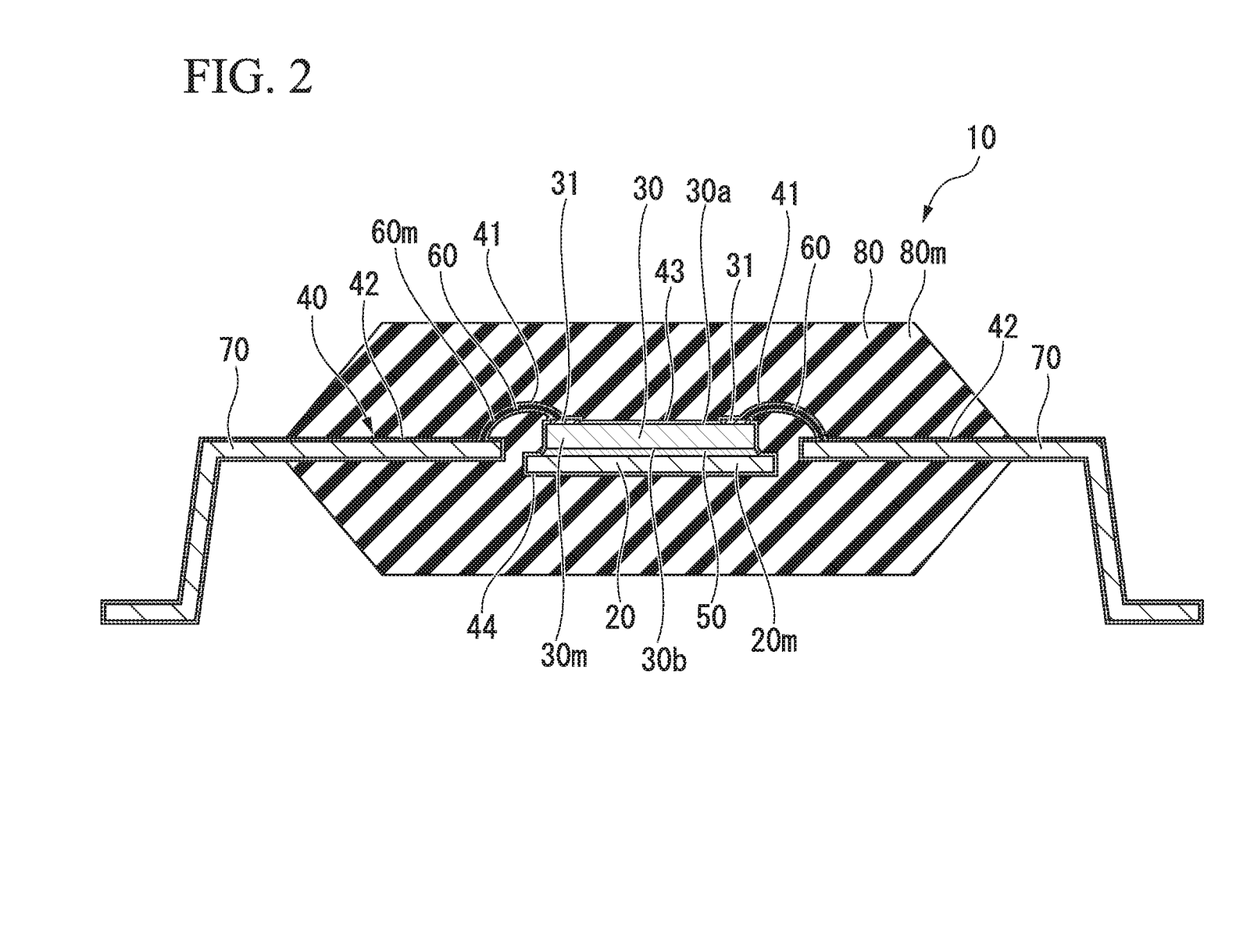
FIG. 2 is a cross-sectional view of a semiconductor device according to the first embodiment.

FIG. 2 is a cross-sectional view of the semiconductor package 10 according to the first embodiment.

As shown in FIG. 2, the semiconductor package 10 includes, for example, a metal base 20, a semiconductor chip 30, a molecular bonding layer 40, a die bonding adhesive layer 50, bonding wires 60, lead frames 70, and a resin mold 80.

The metal base 20 is an example of a "base." The "base" referred to herein may be any member to which the semiconductor chip 30 is fixed and may be made of a non-metal material. In addition, the "base" may be referred to as a "support."

The metal base 20 includes metal (i.e., a metal material) 20m having conductivity. If metal having conductivity is used, the metal base 20 functions as, for example, an electrical ground of the semiconductor package 10. In other words, the semiconductor chip 30 is electrically connected to the metal base 20 (e.g., is connected to ground) through the die bonding adhesive layer 50. In addition, a material having high thermal conductivity may be used for the metal base 20. If a material having high thermal conductivity is used, heat dissipation properties when the semiconductor package 10 is in operation increase. Examples of such a material (i.e., a first material) of the metal base 20 include Cu, Mo, Ag, W, Fe, Ni, and alloys thereof. For example, as a material of the metal base 20, Cu or an alloy of Cu and Mo is preferably used. If such a material is used as a material of the metal base 20, both conductivity and thermal conductivity increase. Also, if the base is made of a non-metal material, a material of the base may be, for example, a resin (i.e., a synthetic resin), a ceramic, or other materials.

The semiconductor chip (e.g., a bare chip) 30 is a member including, for example, a silicon-containing semiconductor as a component. An example of the semiconductor chip 30 may be a silicon chip. The semiconductor chip 30 is, for example, a heterojunction field effect transistor (HFET) made of a material such as GaN or SiC, or a lateral double diffuse MOS transistor (LDMOS) made of a material such as Si. In addition, other examples of the semiconductor chip 30 include an optical semiconductor element, a piezoelectric element, a memory element, a microcomputer element, a sensor element, and a wireless communication element. The "semiconductor chip (or a semiconductor chip body)" referred to herein may be any semiconductor chip including an electric circuit and is not limited to a specific semiconductor chip. An exemplary material of the semiconductor chip 30 is silicon $30m$. Also, a material of the semiconductor chip 30 chemically bonded (e.g., covalently bonded) to the molecular bonding layer 40 may be an insulating material included in an insulating portion of the semiconductor chip 30. In this case, the "silicon $30m$" in the following description may also be understood as an "insulating material."

The semiconductor chip 30 includes a first surface $30a$ and a second surface $30b$. On the first surface $30a$, conductive pads (i.e., connection portions, electrical connection portions, or terminals) 31 as a part of an electric circuit is formed. The second surface $30b$ is opposite to the first surface $30a$. The second surface $30b$ faces the die bonding adhesive layer 50. In the present embodiment, the conductive pad 31 is formed by a metal plating of conductive metal on the first surface $30a$ of the semiconductor chip 30. As the conductive metal, for example, Au, Ni, or Cu is used. For example, the conductive pad 31 has a structure in which a Ni plating layer and an Au plating layer are sequentially laminated on a Cu plating layer that serves as a base of the circuit.

The die bonding adhesive layer 50 is formed between the metal base 20 and the semiconductor chip 30. The die bonding adhesive layer 50 is a connection member that bonds (i.e., joins) the metal base 20 and the semiconductor chip 30 according to, for example, an anchor effect. The die bonding adhesive layer 50 includes a plurality of conductive components and a resin. The die bonding adhesive layer 50 has conductivity when the plurality of conductive components included in the die bonding adhesive layer 50 are in contact with each other and electrically connected each other. In other words, the plurality of conductive components electrically connects the metal base 20 and the semiconductor chip 30.

The bonding wire 60 extends between the lead frame 70 and the conductive pad 31 of the semiconductor chip 30. For example, the bonding wire 60 is a conductive wire member that extends between the conductive pad 31 of the semiconductor chip 30 and the lead frame 70. The bonding wire 60 is electrically connected to the lead frame 70 and the conductive pad 31 of the semiconductor chip 30. The bonding wire 60 is made of, for example, metal $60m$. The metal $60m$ is, for example, gold, copper, or a copper alloy. The metal $60m$ is an example of a "first metal (i.e., a first metal material, or a first material)."

The lead frame (i.e., a connection portion, an electrical connection portion, or an external connection terminal) 70 is an example of each of a "conductor" and a "metal component." The lead frame 70 is an electrical connection terminal for an external member (e.g., a circuit board) of the semiconductor package 10. A part of the lead frame 70 protrudes to the outside of the resin mold 80. That is, the lead frame 70 has a protrusion from the resin mold 80. The lead frame 70 forms, for example, a part of an internal interconnect of the semiconductor package 10.

Figure 3:
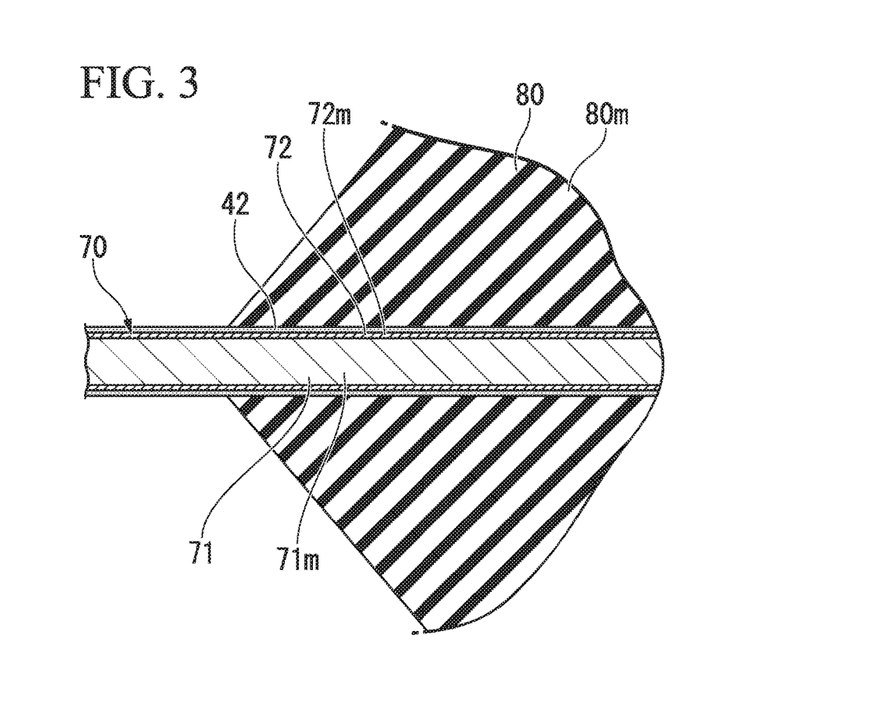
FIG. 3 is an enlarged cross-sectional view of a part of the semiconductor device according to the first embodiment.

FIG. 3 is an enlarged cross-sectional view of a part of the lead frame 70 according to the present embodiment.

As shown in FIG. 3, the lead frame 70 of the present embodiment includes a body 71 and a metal plating layer 72 on the body 71.

The body 71 forms the most part of the lead frame 70. The body 71 is an example of each of a "conductor body" and a "metal base body." The body 71 is made of metal $71m$. The metal $71m$ is, for example, copper or a copper alloy. The metal $71m$ is an example of a "third metal (i.e., a third metal material or a third material)." The "third metal" may be the same as or different from the "first metal."

The metal plating layer 72 is formed on at least a part of the body 71. The metal plating layer 72 defines at least a part of a surface of the lead frame 70. That is, the metal plating layer 72 is formed at a surface of the lead frame 70. The metal plating layer 72 is formed, for example, on the entire surface of the body 71. The metal plating layer 72 is a metal layer for protecting the body 71 from defects such as oxidation. In the present embodiment, the metal plating layer 72 is a barrier layer on the body 71.

For example, when the body 71 is made of copper or a copper alloy, if the body 71 is exposed to air or moisture for a long period of time in a normal state, a copper component may be oxidized. To deal with this issue, the metal plating layer 72 is formed, for example, on a portion exposed to air or moisture within the body 71. In addition, for example, when a member made of copper or a copper alloy is used for a long period of time while being sealed by a resin, a copper component in a metal surface in contact with the resin may be oxidized. To deal with this issue, the metal plating layer 72 is formed, for example, on a surface that faces at least the resin mold 80 within the body 71. As a result, the surface of the body 71 that faces the resin mold 80 is protected from defects due to, for example, oxidation.

In addition, the copper component may diffuse into the resin and adhesiveness between copper or a copper alloy and the resin may decrease. Such a phenomenon can be observed by a pressure cooker test (PCT) at a temperature of 100° C. or higher and a humidity of 75% or higher. In the present embodiment, by forming the metal plating layer 72, it is possible to suppress diffusion of a metal component of the body 71 into the resin mold 80.

As described above, the metal plating layer 72 is useful in protecting the body 71 from various malfunctions.

Metal used for the metal plating layer 72 is metal (i.e., a barrier metal) having, for example, a protection function (i.e., a barrier property). The metal plating layer 72 is made of metal $72m$. The metal $72m$ is an example of a "second metal (i.e., a second metal material, or a second material)." When copper or a copper alloy is used as metal of the body 71, the metal $72m$ includes, for example, at least one of nickel, nickel alloys, titanium, titanium alloys, tungsten, and tungsten alloys. The metal $72m$ of the metal plating layer 72 has a lower diffusion coefficient than the metal $71m$ of the body 71 (i.e., that is, it is less likely to diffuse into the resin). Also, the metal plating layer 72 may be a metal layer having a function other than the barrier layer. For example, the metal plating layer 72 may be a metal layer for decoration or the like.

A thickness of the metal plating layer 72 is, for example, 0.01 μm or more and 10 μm or less. If the thickness of the metal plating layer 72 is the above lower limit value or more, the protection function of the metal plating layer 72 can be effectively exhibited. When a thickness of the molecular bonding layer 40 is the above upper limit value or less, it is possible to suppress an increase in the thickness of the semiconductor package 10 due to the metal plating layer 72.

The resin mold (i.e., an insulating portion) 80 is an example of a "resin portion." The resin mold 80 is a member that protects the semiconductor chip 30 and the bonding wires 60 from external pressure, moisture, contaminants, and the like. As shown in FIG. 2, the resin mold 80 integrally covers the metal base 20, the semiconductor chip 30, the die bonding adhesive layer 50, at least a part of each of the lead frames 70, and the bonding wires 60. The resin mold 80 is formed on the molecular bonding layer 40. The resin mold 80 is made of a resin (i.e., a resin material) 80m. The resin 80m may be any material having an insulation property and is not particularly limited. The resin 80m is, for example, a thermoplastic resin or a thermosetting resin. As the resin 80m, an epoxy resin or the like may be used. In addition, a stress relaxation agent such as fused spherical silica may be added to the resin 80m as an additive.

Next, the molecular bonding layer 40 will be described.

As shown in FIG. 2 and FIG. 3, the semiconductor package 10 according to the present embodiment includes the molecular bonding layer 40. The molecular bonding layer 40 is formed between at least a surface of the bonding wire 60 and the resin mold 80. Although the molecular bonding layer 40 is actually very thin, it is drawn with a certain thickness in FIGS. 2 and 3 for convenience of description.

In the present embodiment, the molecular bonding layer 40 includes at least first portions 41, second portions 42, a third portion 43, and a fourth portion 44.

The first portion 41 is formed between the surface of the bonding wire 60 and the resin mold 80 and is chemically bonded to both the bonding wire 60 and the resin mold 80. That is, the first portion 41 bonds the bonding wire 60 and the resin mold 80.

The second portion 42 is formed between the surface of the lead frame 70 (e.g., a surface of the metal plating layer 72) and the resin mold 80 and is chemically bonded to both the lead frame 70 (e.g., the metal plating layer 72) and the resin mold 80. That is, the second portion 42 bonds the lead frame 70 (e.g., the metal plating layer 72) and the resin mold 80.

The third portion 43 is formed between a surface of the semiconductor chip 30 and the resin mold 80 and is chemically bonded to both the semiconductor chip 30 and the resin mold 80. That is, the third portion 43 bonds the semiconductor chip 30 and the resin mold 80.

The fourth portion 44 is formed between a surface of the metal base 20 and the resin mold 80 and is chemically bonded to both the metal base 20 and the resin mold 80. That is, the fourth portion 44 bonds the metal base 20 and the resin mold 80.

The first portions 41, the second portions 42, the third portion 43, and the fourth portion 44 are, for example, integrally formed with each other (i.e., formed in a series with each other).

First, the first portion 41 of the molecular bonding layer 40 will be described in detail.

The molecular bonding layer 40 of the present embodiment includes molecular bonding systems 40r (refer to FIG. 4) formed by a molecular bonding agent. The molecular bonding agent is a compound capable of forming, for example, a chemical bond (e.g., a covalent bond) with a resin and a metal. The term "covalent bond" herein broadly refers to a bond having a covalent bonding property and includes a coordinate bond, a semi-covalent bond and the like. In addition, the term "molecular bonding system" herein refers to a substance that remains in a joint part after a molecular bonding agent is chemically bonded (i.e., chemically reacted).

As the molecular bonding agent, for example, a compound such as a triazine derivative may be exemplified. As the triazine derivative, a compound expressed by the following General Formula (C1) may be employed.

(where, R represents a hydrocarbon group or a hydrocarbon group which may include a hetero atom or a functional group therebetween; X represents a hydrogen atom or a hydrocarbon group; Y represents an alkoxy group; Z represents a thiol group, an amino group or an azido group, which may be a salt, or a hydrocarbon group which may include a hetero atom or a functional group therebetween; n1 represents an integer of 1 to 3; and n2 represents an integer of 1 to 2.)

In General Formula (C1), R is preferably a hydrocarbon group having 1 to 7 carbon atoms or a group having a main chain in which a nitrogen atom is included. X represents a hydrocarbon group having 1 to 3 carbon atoms. Y represents an alkoxy group having 1 to 3 carbon atoms. n1 is preferably 3. n2 is preferably 2. Z preferably represents a thiol group, an amino group or an azido group, which may be a salt, or an alkyl group. As a cation element that forms a salt, an alkali metal is preferable. Among alkali metals, Li, Na, K or Cs is more preferable. When n2 is 2, at least one Z is preferably a thiol group, an amino group or an azido group, which is a salt.

At least a part of the first portion 41 of the molecular bonding layer 40 (i.e., at least a part of a molecular bonding agent that forms the molecular bonding layer 40) is chemically bonded (e.g., covalently bonded) to the metal 60m included in the bonding wire 60. Similarly, at least a part of the first portion 41 of the molecular bonding layer 40 (i.e., at least a part of a molecular bonding agent that forms the molecular bonding layer 40) is chemically bonded (e.g., covalently bonded) to the resin 80m included in the resin mold 80. As a result, the bonding wire 60 and the resin mold 80 are bonded via a chemical bond between the bonding wire 60 and the molecular bonding layer 40 and a chemical bond between the resin mold 80 and the molecular bonding layer 40. Thereby, the bonding wire 60 and the resin mold 80 are firmly adhered.

Figure 4:
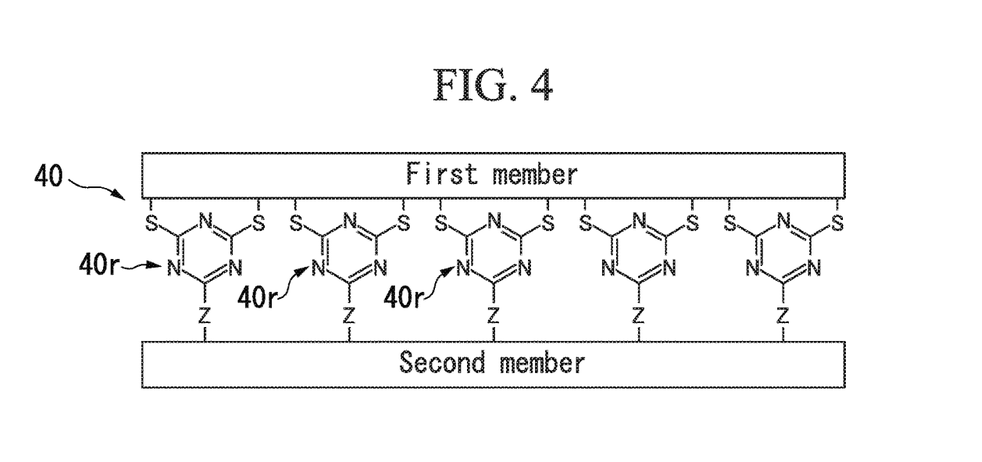
FIG. 4 schematically illustrates of a composition of a molecular bonding layer in the semiconductor package according to the first embodiment.

FIG. 4 schematically illustrates an example of a composition of the molecular bonding layer 40.

As shown in FIG. 4, the molecular bonding layer 40 includes, for example, a plurality of molecular bonding systems 40r. The molecular bonding system 40r includes a molecular bonding agent residue that is formed when the above-described molecular bonding agent is chemically reacted with bonding targets (a first member and a second member). For example, the molecular bonding system 40r includes a molecular bonding agent residue that is formed when the above-described molecular bonding agent is chemically reacted with the bonding wire 60 and the resin mold 80. The molecular bonding agent residue is, for example, a triazine dithiol residue as shown in FIG. 4. The molecular bonding system 40r may include "S" or "Z" in FIG. 4. An example of "Z" in FIG. 4 is an amino hydrocarbylsiloxy group. For example, the molecular bonding layer 40 includes a first molecular bonding system 40r that is chemically bonded (e.g., covalently bonded) to the metal 60m of the bonding wire 60, and a second molecular bonding system 40r that is chemically bonded (e.g., covalently bonded) to the resin 80m of the resin mold 80.

For example, at least a part of the first portion 41 of the molecular bonding layer 40 is formed in a monomolecular film form. That is, the first portion 41 of the molecular bonding layer 40 consists at least in part of a monomolecular layer. At least one of the molecular bonding systems 40r included in the first portion 41 of the molecular bonding layer 40 is chemically bonded (e.g., covalently bonded) to both the metal 60m of the bonding wire 60 and the resin 80m of the resin mold 80. In other words, one molecule (e.g., the molecular bonding system 40r) of the molecular bonding agent included in the first portion 41 of the molecular bonding layer 40 is chemically bonded (e.g., covalently bonded) to both the metal 60m of the bonding wire 60 and the resin 80m of the resin mold 80.

The second portion 42, the third portion 43, and the fourth portion 44 of the molecular bonding layer 40 have substantially the same configuration as the first portion 41. For example, at least a part of the second portion 42 of the molecular bonding layer 40 (i.e., at least a part of a molecular bonding agent that forms the molecular bonding layer 40) is chemically bonded (e.g., covalently bonded) to metal (i.e., a metal material) included in the lead frame 70. In the present embodiment, at least a part of the second portion 42 of the molecular bonding layer 40 is chemically bonded (e.g., covalently bonded) to the metal 72m included in the metal plating layer 72 of the lead frame 70. Similarly, at least a part of the second portion 42 of the molecular bonding layer 40 (i.e., at least a part of a molecular bonding agent that forms the molecular bonding layer 40) is chemically bonded (e.g., covalently bonded) to the resin 80m included in the resin mold 80. That is, the lead frame 70 and the resin mold 80 are bonded via a chemical bond between the lead frame 70 and the molecular bonding layer 40 and a chemical bond between the resin mold 80 and the molecular bonding layer 40. Thereby, the lead frame 70 and the resin mold 80 are firmly bonded.

For example, the metal plating layer 72 made of a barrier metal (e.g., at least one of nickel, nickel alloys, titanium, titanium alloys, tungsten, and tungsten alloys) exhibits a satisfactory protection function for the body 71 made of, for example, copper or a copper alloy, but does not exhibit favorable adhesiveness for the resin mold 80. However, even in this case, when the molecular bonding layer 40 is formed between the metal plating layer 72 and the resin mold 80, it is possible to favorably ensure adhesiveness between the metal plating layer 72 and the resin mold 80.

For example, at least a part of the second portion 42 of the molecular bonding layer 40 is formed in a monomolecular film form. At least one of the molecular bonding systems 40r included in the second portion 42 of the molecular bonding layer 40 is chemically bonded (e.g., covalently bonded) to both the metal 72m of the metal plating layer 72 of the lead frame 70 and the resin 80m of the resin mold 80. In other words, one molecule (e.g., the molecular bonding system 40r) of the molecular bonding agent included in the second portion 42 of the molecular bonding layer 40 is chemically bonded (e.g., covalently bonded) to both the metal 72m of the metal plating layer 72 of the lead frame 70 and the resin 80m of the resin mold 80.

At least a part of the third portion 43 of the molecular bonding layer 40 (i.e., at least a part of a molecular bonding agent that forms the molecular bonding layer 40) is chemically bonded (e.g., covalently bonded) to the silicon 30m included in the semiconductor chip 30. Similarly, at least a part of the third portion 43 of the molecular bonding layer 40 (i.e., at least a part of a molecular bonding agent that forms the molecular bonding layer 40) is chemically bonded (e.g., covalently bonded) to the resin 80m included in the resin mold 80. That is, the semiconductor chip 30 and the resin mold 80 are bonded via a chemical bond between the semiconductor chip 30 and the molecular bonding layer 40 and a chemical bond between the resin mold 80 and the molecular bonding layer 40. Thereby, the semiconductor chip 30 and the resin mold 80 are firmly bonded.

For example, at least a part of the third portion 43 of the molecular bonding layer 40 is formed in a monomolecular film form. At least one of the molecular bonding systems 40r included in the third portion 43 of the molecular bonding layer 40 is chemically bonded (e.g., covalently bonded) to both the silicon 30m of the semiconductor chip 30 and the resin 80m of the resin mold 80. In other words, one molecule (e.g., the molecular bonding system 40r) of the molecular bonding agent included in the third portion 43 of the molecular bonding layer 40 is chemically bonded (e.g., covalently bonded) to both the silicon 30m of the semiconductor chip 30 and the resin 80m of the resin mold 80.

At least a part of the fourth portion 44 of the molecular bonding layer 40 (i.e., at least a part of a molecular bonding agent that forms the molecular bonding layer 40) is chemically bonded (e.g., covalently bonded) to the metal 20m included in the metal base 20. Similarly, at least a part of the fourth portion 44 of the molecular bonding layer 40 (i.e., at least a part of a molecular bonding agent that forms the molecular bonding layer 40) is chemically bonded (e.g., covalently bonded) to the resin 80m included in the resin mold 80. That is, the metal base 20 and the resin mold 80 are joined via a chemical bond between the metal base 20 and the molecular bonding layer 40 and a chemical bond between the resin mold 80 and the molecular bonding layer 40. Thereby, the metal base 20 and the resin mold 80 are firmly bonded.

For example, at least a part of the fourth portion 44 of the molecular bonding layer 40 is formed in a monomolecular film form. At least one of the molecular bonding systems 40r included in the fourth portion 44 of the molecular bonding layer 40 is chemically bonded (e.g., covalently bonded) to both the metal 20m of the metal base 20 and the resin 80m of the resin mold 80. In other words, one molecule (e.g., the molecular bonding system 40r) of the molecular bonding agent included in the fourth portion 44 of the molecular bonding layer 40 is chemically bonded (e.g., covalently bonded) to both the metal 20m of the metal base 20 and the resin 80m of the resin mold 80.

An adhesion strength between at least one of the bonding wire 60, the lead frame 70, the semiconductor chip 30, and the metal base 20, and the resin mold 80 is preferably 2 MPa or more, more preferably 5 MPa or more, still more preferably 6 MPa or more, and most preferably 10 MPa or more. The adhesion strength can be measured by, for example, a shear test. As a specific example of a tensile test, methods defined in SEMIG69-0996 may be employed.

The molecular bonding systems 40r chemically bonded (e.g., covalently bonded) to the metal 60m, the metal 72m, the silicon 30*m*, and the metal 20*m* and the molecular bonding systems 40*r* chemically bonded (e.g., covalently bonded) to the resin 80*m* may be the same or different from each other. When one molecule of the molecular bonding system 40*r* is chemically bonded (e.g., covalently bonded) to both the metal 60*m*, the metal 72*m*, the silicon 30*m*, or the metal 20*m*, and the resin 80*m*, adhesiveness between the bonding wire 60, the lead frame 70, the semiconductor chip 30 or the metal base 20, and the resin mold 80 further increases.

The thickness of the molecular bonding layer 40 is preferably 0.5 nm or more and 20 nm or less and more preferably 1 nm or more and 10 nm or less. If the thickness of the molecular bonding layer 40 is the lower limit value or more, it is possible to further increase adhesiveness between the bonding wire 60, the lead frame 70, the semiconductor chip 30 or the metal base 20, and the resin mold 80. If the thickness of the molecular bonding layer 40 is the upper limit value or less, it is possible to reduce an amount of the molecular bonding agent used for the molecular bonding layer 40.

At least a part of the molecular bonding layer 40 formed on the surface of the bonding wire 60, the lead frame 70, the semiconductor chip 30, or the metal base 20 preferably has a monomolecular film (molecular monolayer) form. For example, preferably, 30% or more and 100% or less of the molecular bonding layer 40 has a monomolecular film form. More preferably, the entire molecular bonding layer 40 has a monomolecular film form. In a region that is formed in a monomolecular film form in the molecular bonding layer 40, one molecule of the molecular bonding agent is chemically bonded (e.g., covalently bonded) to both the metal 60*m*, the metal 72*m*, the silicon 30*m* or the metal 20*m*, and the resin 80*m*. For that reason, it is possible to further increase adhesiveness between the bonding wire 60, the lead frame 70, the semiconductor chip 30 or the metal base 20, and the resin mold 80, and it is possible to minimize an amount of the molecular bonding agent used for the molecular bonding layer 40.

A covering density of the molecular bonding layer 40 with respect to the bonding wire 60, the lead frame 70, the semiconductor chip 30, and the metal base 20 is preferably 20 area % or more, more preferably 30 area % or more, and most preferably 50 area % or more. If the covering density is the above lower limit value or more, it is possible to further increase adhesiveness between the bonding wire 60, the lead frame 70, the semiconductor chip 30 or the metal base 20, and the resin mold 80. Since a higher covering density is preferable, the upper limit value thereof is not particularly limited. However, as the upper limit value of the covering density, for example, 70 area % or 80 area % can be exemplified. Also, if the covering density of the molecular bonding layer 40 is 100 area %, it means that the molecular bonding agent is packed theoretically closest with respect to a surface of a target to be covered. The covering density of the molecular bonding agent can be obtained based on results measured by an X-ray diffraction method.

Next, a method of manufacturing the semiconductor package 10 according to the present embodiment will be described.

A method of manufacturing the semiconductor package 10 includes covering surfaces of the bonding wires 60, the metal plating layers 72 of the lead frames 70, the semiconductor chip 30, and the metal base 20 with the molecular bonding agent. As a result, the molecular bonding layer 40 chemically bonded to the metal 60*m*, the metal 72*m*, the silicon 30*m*, and the metal 20*m* included in the bonding wires 60, the metal plating layers 72 of the lead frames 70, the semiconductor chip 30, and the metal base 20 is formed. After that, a surface of the molecular bonding layer 40 is covered with the resin 80*m*. As a result, the resin mold 80 chemically bonded to the molecular bonding layer 40 is formed.

Figure 5:
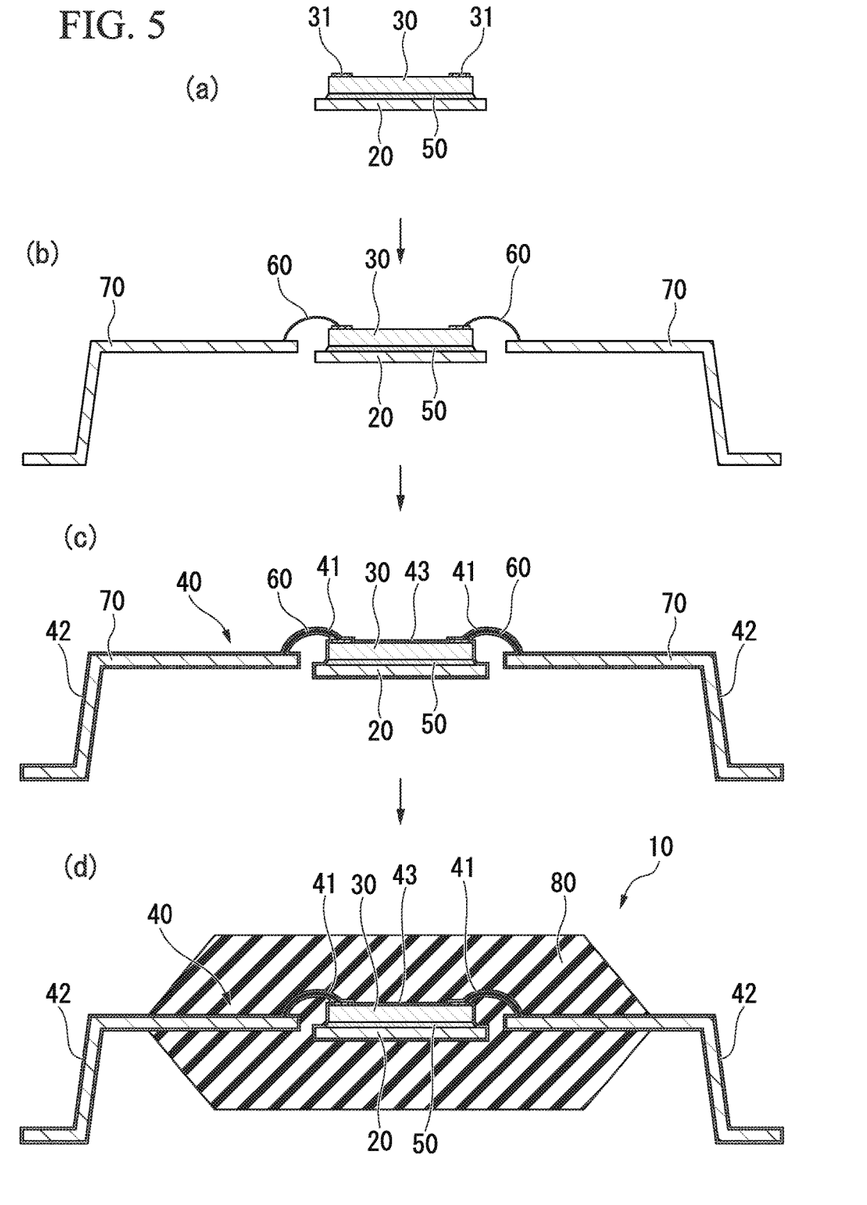
FIG. 5 is a cross-sectional view of a structure in process to show a flow of a method of manufacturing the semiconductor device according to the first embodiment.

FIG. 5 is a cross-sectional view of a structure in process to show a flow of a method of manufacturing the semiconductor package 10.

In the present embodiment, first, the metal base 20 and the semiconductor chip 30 are overlapped with the die bonding adhesive layer 50 disposed therebetween. Through this process, the semiconductor chip 30 is fixed to the metal base 20 ((a) in FIG. 5). Next, the semiconductor chip 30 and the lead frame 70 are electrically connected via the bonding wires 60 ((b) in FIG. 5).

Next, the surfaces of the bonding wires 60, the surfaces of the lead frames 70, the surface of the semiconductor chip 30, and the surface of the metal base 20 are covered with the molecular bonding agent (i.e., the molecular bonding agent is applied to the surfaces of the bonding wires 60, the surfaces of the lead frames 70, the surface of the semiconductor chip 30, and the surface of the metal base 20). As a result, the molecular bonding layer 40 is formed ((c) in FIG. 5). Here, the "molecular bonding layer" described in the present disclosure may refer to a molecular bonding layer, at least a part of which has not yet chemically reacted (e.g., has not chemically bonded), in addition to a molecular bonding layer that has chemically reacted (e.g., chemically bonded). The molecular bonding layer, at least a part of which has not yet chemically reacted, may also be understood as a "a layer of the molecular bonding agent."

The molecular bonding layer 40 is formed, for example, by applying a molecular bonding agent solution including the above-described molecular bonding agent to the surfaces of the bonding wires 60, the surfaces of the lead frames 70, the surface of the semiconductor chip 30, and the surface of the metal base 20. An exemplary method of applying the molecular bonding agent solution includes a method of immersing the bonding wires 60, the lead frames 70, the semiconductor chip 30, and the metal base 20 in the molecular bonding agent solution and a method of spraying the molecular bonding agent solution on such members. In the present embodiment, the molecular bonding agent is substantially simultaneously applied to the bonding wires 60, the lead frames 70, the semiconductor chip 30, and the metal base 20. "the molecular bonding agent is substantially simultaneously applied" means that there is no other process (e.g., a process of mounting another member) between processes of applying the molecular bonding agent to such members. In other words, one process of applying the molecular bonding agent to one of members is performed immediately after, immediately before, or while another process of applying the molecular bonding agent to another one of the members is performed. From a different point of view, for example, "the molecular bonding agent is substantially simultaneously applied" means that the molecular bonding agent is continuously applied to such members.

The molecular bonding agent is preferably used in the form of a molecular bonding agent solution. The molecular bonding agent solution can be prepared by dissolving the above-described molecular bonding agent in a solvent.

Exemplary solvents include water; alcohols such as methanol, ethanol, isopropanol, ethylene glycol, propylene glycol, cellosolve and carbitol; ketones such as acetone, methyl ethyl ketone and cyclohexanone; aromatic hydrocarbons such as benzene, toluene and xylene; aliphatic hydrocarbons such as hexane, octane, decane, dodecane and octadecane; esters such as ethyl acetate, methyl propionate and methyl phthalate; and ethers such as tetrahydrofuran, ethyl butyl ether and anisole. In addition, a mixture of such solvents can be used.

A concentration of the molecular bonding agent solution is preferably 0.001 mass % or more and 1 mass % or less and more preferably 0.01 mass % or more and 0.1 mass % or less. When the concentration of the molecular bonding agent solution is the lower limit value or more, the covering density of the molecular bonding agent increases. As a result, it is possible to further increase adhesiveness between members. When the concentration of the molecular bonding agent solution is the above upper limit value or less, it is possible to reliably dissolve the molecular bonding agent in a solvent.

The prepared molecular bonding agent solution is applied to surfaces of the bonding wires 60, the lead frames 70, the semiconductor chip 30, and the metal base 20. When the bonding wires 60, the lead frames 70, the semiconductor chip 30, and the metal base 20 to which the molecular bonding agent solution is applied are left, chemical bonding (e.g., covalent bonding) of the metal 60m of the bonding wire 60, the metal 72m of the lead frame 70, the silicon 30m of the semiconductor chip 30 and the metal 20m of the metal base 20 with the molecular bonding agent may occur. Further, an operation of applying energy (e.g., heat or light (e.g., ultraviolet rays)) to the molecular bonding layer 40 may be performed. According to the operation of applying energy, chemical bonding (e.g., covalent bonding) between the molecular bonding agent and materials of the above members may be further promoted. As a method of applying external energy, for example, heat and ultraviolet ray emission can be employed. When heat is used, heating at about 150 to 200° C. is performed for 5 minutes or more, preferably 60 minutes or more, more preferably 80 minutes or more, still more preferably 120 minutes or more, and most preferably 240 minutes. For example, depending on a material of the molecular bonding layer, a time between 5 minutes and 120 minutes, a time between 60 minutes and 240 minutes, and preferably, a time between 80 minutes and 240 minutes, may be selected. In addition, a wavelength of ultraviolet rays to be emitted is preferably 250 nm or less and an emission time is appropriately determined according to an applied amount of the molecular bonding agent solution. Then, the member to which the molecular bonding agent is applied may be cleaned and dried for removing an excess molecular bonding agent or solution. For example, if the excess molecular bonding agent is removed, the molecular bonding layer 40 is formed in a monomolecular film (molecular monolayer) form. A cleaning solution can be selected from among, for example, the same solvents described above used for the molecular bonding agent solution. Drying can be performed at 150° C. to 200° C. According to such an operation, the surfaces of the bonding wires 60, the lead frames 70, the semiconductor chip 30, and the metal base 20 are covered with the molecular bonding agent (e.g., the molecular bonding system 40r). That is, the molecular bonding layer 40 chemically bonded (e.g., covalently bonded) to the materials included in the bonding wires 60, the lead frames 70, the semiconductor chip 30, and the metal base 20 is formed. Also, in the present embodiment, the operation of applying heat as external energy may be performed by supplying a heated thermosetting resin to the vicinity of the bonding wires 60, the lead frames 70, the semiconductor chip 30, and the metal base 20 as the resin 80m of the resin mold 80.

The thickness of the molecular bonding layer 40 can be adjusted according to conditions such as a concentration and an applied amount of the molecular bonding agent solution, a cleaning time, and the number of cleanings.

Next, the resin 80m to form the resin mold 80 is supplied to the surface of the molecular bonding layer 40. That is, the resin 80m is supplied to cover the bonding wires 60, at least a part of each of the lead frames 70, the semiconductor chip 30, and the metal base 20. As a result, the resin 80m comes in contact with the molecular bonding layer 40. Also, the resin 80m and the molecular bonding layer 40 is chemically bonded (e.g., covalently bonded). For example, the resin 80m in a relatively high temperature state is supplied to cover the bonding wire 60, at least a part of each of the lead frames 70, the semiconductor chip 30, and the metal base 20. As a result, chemical bonding (e.g., covalent bonding) between the resin 80m and the molecular bonding layer 40 is promoted. Also, the resin mold 80 bonded to the bonding wires 60, at least a part of each of the lead frames 70, the semiconductor chip 30, and the metal base 20 is formed by the molecular bonding layer 40 ((d) in FIG. 5). Also, a method of supplying the resin 80m is not particularly limited, and various known methods can be used. As the method of supplying the resin 80m, for example, transfer molding and compression molding may be employed.

Also, chemical bonding (e.g., covalent bonding) of the molecular bonding agent may be carried out without applying any energy such as heat or light. Alternatively, chemical bonding (e.g., covalent bonding) of the molecular bonding agent may be carried out while applying energy such as heat or light.

Then, for example, processes such as after curing, honing, exterior plating, and separation are performed to complete the semiconductor package 10.

Here, as a comparative example, it is assumed that a chemical coating treatment is performed on the surface of the metal plating layer 72 of the lead frame 70 in advance to increase adhesiveness of the lead frame 70 with respect to the resin mold 80. In a mounting process including die bonding and wire bonding, a thermal load of 150° C. to 400° C. is applied. For that reason, the coating formed by the coating treatment may deteriorate or be decomposed due to the thermal energy. In addition, when the chemical coating treatment is performed on the lead frame 70, a die bonding or wire bonding process may be inhibited.

On the other hand, according to the molecular bonding layer 40 of the present embodiment, deterioration or decomposition of the molecular bonding layer 40 due to the thermal load in the mounting process is less likely to occur. For that reason, it is possible to ensure adhesiveness between the metal plating layer 72 of the lead frame 70 and the resin mold 80 by the molecular bonding layer 40. In addition, the molecular bonding agent is applied after the die bonding or wire bonding process. For that reason, the molecular bonding layer 40 does not inhibit the die bonding or wire bonding process.

Next, several modification examples of the first embodiment will be described.

Figure 6:
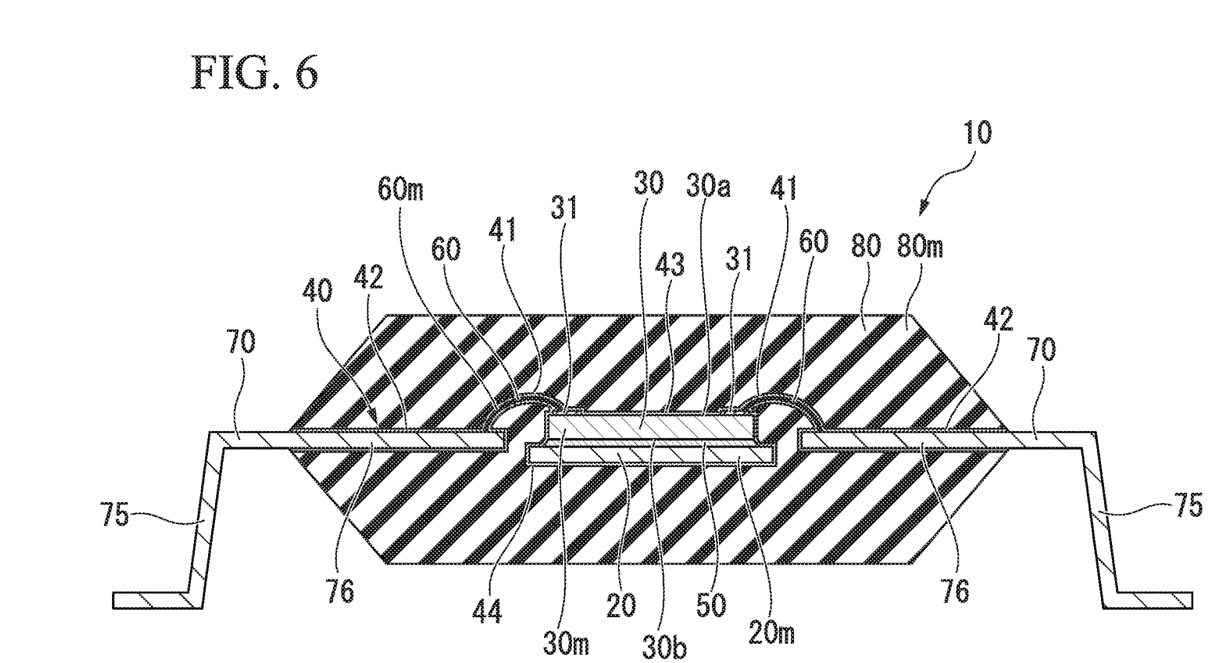
FIG. 6 is a cross-sectional view of a semiconductor device according to a first modification example of the first embodiment.

FIG. 6 is a cross-sectional view of the semiconductor package 10 according to a first modification example of the first embodiment.

As shown in FIG. 6, each of the lead frames 70 includes a first portion 75 that protrudes from the resin mold 80 and a second portion 76 that is covered by the resin mold 80.

In this modification example, for the lead frame 70, the molecular bonding layer 40 is formed only on surfaces of the second portions 76 of the lead frames 70. That is, the molecular bonding layer 40 is not formed on surfaces of the first portions 75 of the lead frames 70. Such a configuration is formed, for example, by applying the molecular bonding agent while the first portion 75 of the lead frame 70 is covered with a mask.

According to such a configuration, burrs or the like of the resin mold 80 are less likely to stick to the first portions 75 of the lead frame 70. For that reason, burrs of the resin mold 80 are more likely to be removed.

Figure 7:
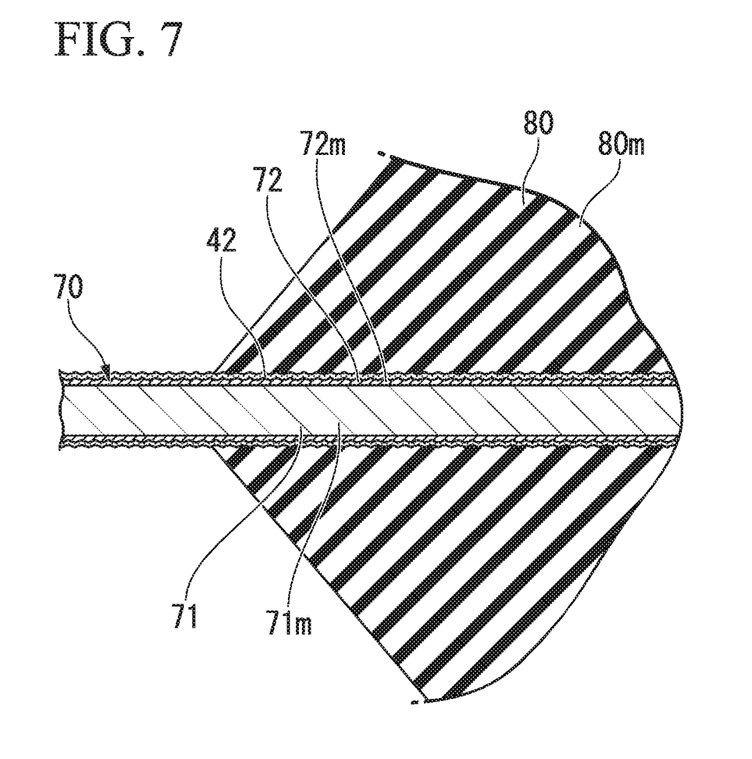
FIG. 7 is an enlarged cross-sectional view of a part of a semiconductor device according to a second modification example of the first embodiment.

FIG. 7 is an enlarged cross-sectional view of a part of the semiconductor package 10 according to a second modification example of the first embodiment.

As shown in FIG. 7, in the present example, the surface of the lead frame 70 (e.g., the surface of the metal plating layer 72) is coarsened by, for example, etching. For example, the roughness of the surface of the lead frame 70 is 0.1 µm or more (an arithmetic average roughness Ra). The arithmetic average roughness Ra is defined by, for example, Japanese Industrial Standards (JIS).

According to such a configuration, it is possible to further increase the bonding strength between the lead frame 70 and the resin mold 80 according to a composite effect of the molecular bonding layer 40 and an anchor effect according to the coarsened surface.

Second Embodiment

A second embodiment will be described with reference to FIG. 8. The second embodiment is different from the first embodiment in that the semiconductor package 10 includes a board 90 in place of the metal base 20. Configurations not described below are the same as those in the first embodiment.

Figure 8:
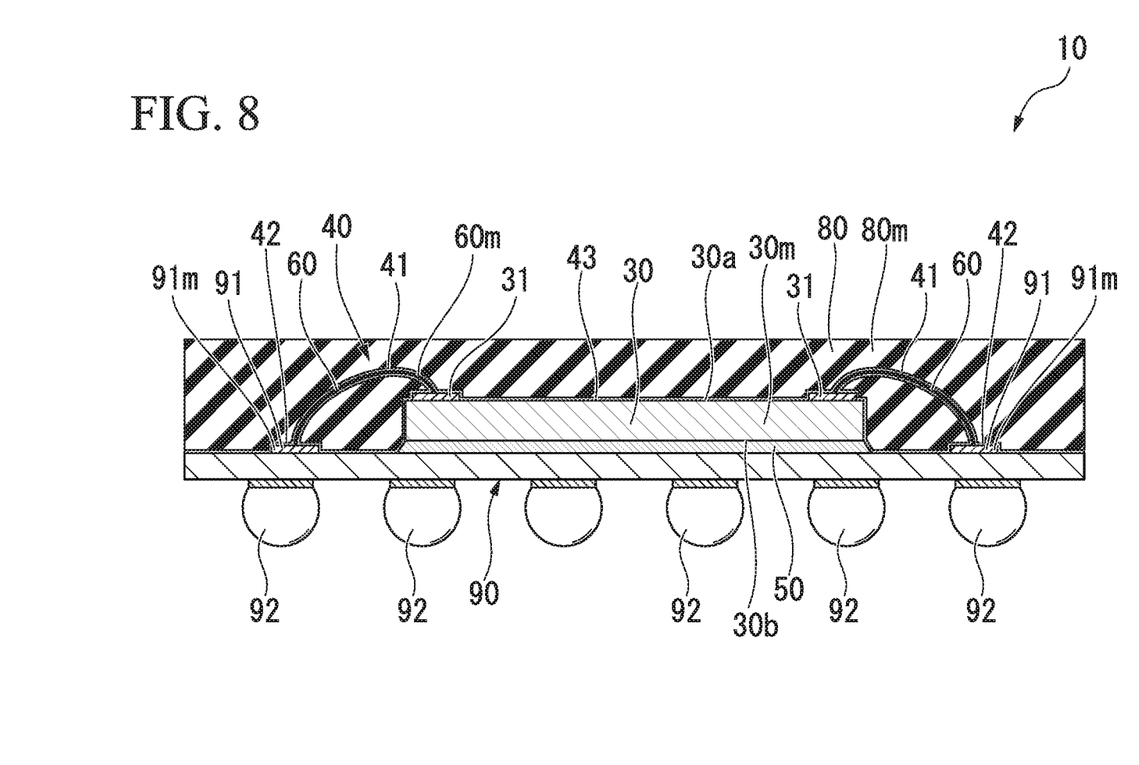
FIG. 8 is a cross-sectional view of a semiconductor device according to a second embodiment.

FIG. 8 is a cross-sectional view of the semiconductor package 10 according to the present embodiment.

As shown in FIG. 8, the semiconductor package 10 includes the board 90, the semiconductor chip 30, the molecular bonding layer 40, the die bonding adhesive layer 50, the bonding wires 60, and the resin mold 80.

The board (e.g., an interposer board) 90 is another example of a "base." The board 90 is made of, for example, a resin (i.e., a synthetic resin) or a ceramic. In the present embodiment, the semiconductor chip 30 is mounted on the board 90. The board 90 includes conductive pads (i.e., connection portions, electrical connection portions, or terminals) 91, a plurality of solder connection portions (i.e., external connection terminals) 92, and a wiring pattern that electrically connects the conductive pads 91 and the solder connection portions 92. The bonding wires 60 are formed between the conductive pads 91 of the board 90 and the conductive pads 31 of the semiconductor chip 30. That is, the bonding wire 60 extends between the conductive pad 31 of the semiconductor chip 30 and the conductive pad 91 of the board 90. The conductive pad 91 of the board 90 is covered by the resin mold 80. The conductive pad 91 of the board 90 is an example of a "conductor." The die bonding adhesive layer 50 is formed between the board 90 and the semiconductor chip 30.

In the present embodiment, the molecular bonding layer 40 is formed on the surfaces of the bonding wires 60, surfaces of the conductive pads 91 of the board 90, the surface of the board 90 that faces the resin mold 80, and the surface of the semiconductor chip 30. The molecular bonding layer 40 joins the bonding wires 60, the conductive pads 91 of the board 90, the board 90 and the semiconductor chip 30 with the resin mold 80.

For example, the molecular bonding layer 40 includes the first portions 41, second portions 42, and the third portion 43. The first portion 41 and the third portion 43 are substantially the same as the first portion 41 and the third portion 43 in the first embodiment. The second portion 42 of the present embodiment is formed between the surface of the conductive pad 91 and the resin mold 80 and is chemically bonded to both the conductive pad 91 and the resin mold 80. For that reason, the second portion 42 bonds the conductive pad 91 and the resin mold 80. For example, at least a part of the second portion 42 of the molecular bonding layer 40 (i.e., at least a part of a molecular bonding agent that forms the molecular bonding layer 40) is chemically bonded (e.g., covalently bonded) to metal 91m of the conductive pad 91. For example, one molecule (e.g., the molecular bonding system 40r) of the molecular bonding agent included in the second portion 42 of the molecular bonding layer 40 is chemically bonded (e.g., covalently bonded) to both the metal 91m of the conductive pad 91 and the resin 80m of the resin mold 80.

Third Embodiment

A third embodiment will be described with reference to FIG. 9. This embodiment is different from the first embodiment in that a metal plating 72 is formed at only one surface of a metal component 100. Configurations not described below are the same as those in the first embodiment.

Figure 9:
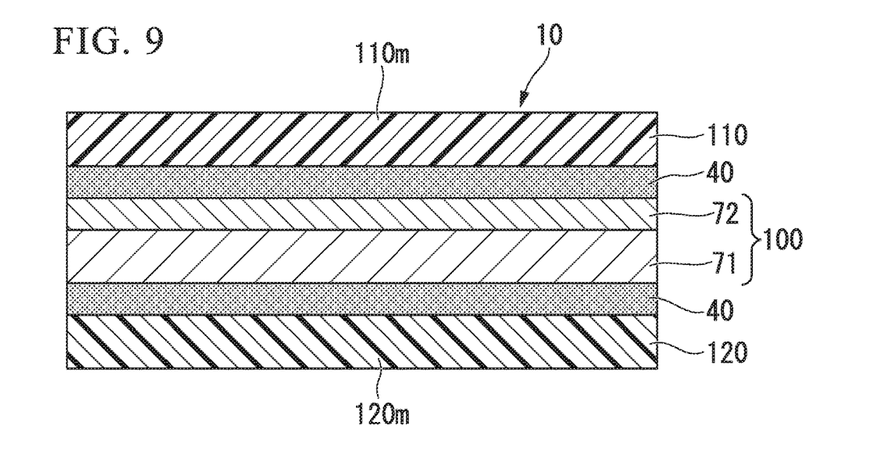
FIG. 9 is an enlarged cross-sectional view of a part of a semiconductor device according to a third embodiment.

FIG. 9 is a cross-sectional view of a part of the semiconductor package 10 according to the third embodiment.

As shown in FIG. 9, in the semiconductor package 10 of the present embodiment, a resin layer 110 is bonded to a surface opposite to a resin layer 120 in the metal component (i.e., a metal member, or a metal board) 100 via the molecular bonding layer 40. That is, one surface of the metal component 100 is covered by the resin layer (i.e., a resin portion, or an insulating portion) 110, and the other surface of the metal component 100 is covered by the resin layer (i.e., a resin portion and an insulating portion) 120. In addition, adhesiveness between the metal component 100 and the resin layer 110 (e.g., between the metal plating layer 72 and the resin layer 110) is increased by the molecular bonding layers 40. As a result, it is possible to effectively protect the metal component 100 from external pressure, moisture, contaminants, and the like.

A method of manufacturing the semiconductor package 10 of the third embodiment may be same as the method of producing the semiconductor package 10 of the first embodiment. In the method of manufacturing the semiconductor package 10, the molecular bonding agent solution is applied to the surface of the metal plating layer 72 and the surface opposite thereto in the metal component 100, and the molecular bonding layers 40 are formed. Next, resins 110m and 120m to form the resin layers 110 and 120 are applied to the surfaces of the molecular bonding layers 40 to form a film. Through these processes, it is possible to produce the semiconductor package 10 according to the third embodiment.

Fourth Embodiment

A fourth embodiment will be described with reference to FIG. 10. The fourth embodiment is different from the third embodiment in that metal plating layers 72 and 72A are formed on both surfaces of the metal component 100. Configurations not described below are the same as those in the third embodiment.

Figure 10:
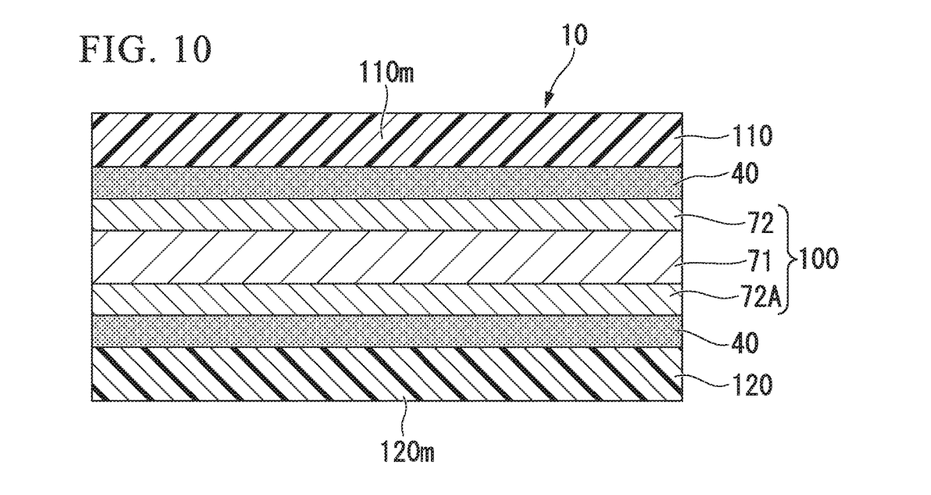
FIG. 10 is an enlarged cross-sectional view of a part of a semiconductor device according to a fourth embodiment.

FIG. 10 is a cross-sectional view of a part of the semiconductor package 10 according to the fourth embodiment. As shown in FIG. 10, in the semiconductor package 10, the metal plating layer 72A, the molecular bonding layer 40, and the resin layer 120 are laminated on a surface opposite to the metal plating layer 72 in the body 71 of the metal component 100. The metal plating layer 72A is substantially the same plating layer as the metal plating layer 72. That is, on a surface opposite to the metal plating layer 72 in the metal component 100 of the semiconductor package 10, the metal plating layer 72A is formed. On a surface of the metal plating layer 72A, the resin layer 120 is bonded via the molecular bonding layer 40. That is, one surface of the metal component 100 is covered by the metal plating layer 72 and the resin layer 110, and the other surface of the metal component 100 is covered by the metal plating layer 72A and the resin layer 120. As a result, over a wide range of the surface of the metal component 100, both a protection function derived from the metal plating layers 72 and 72A and a protection function derived from the resin layers 110 and 120 can be obtained.

A method of manufacturing the semiconductor package 10 of the fourth embodiment may be the same as the method of manufacturing the semiconductor package 10 according to the first embodiment. In the method of manufacturing the semiconductor package 10, first, the metal component 100 including the metal plating layer 72 formed on one surface of the metal component 100 and the metal plating layer 72A formed on the other surface of the metal component 100 are prepared. Next, the molecular bonding agent solution is applied to surfaces of the metal plating layers 72 and 72A of the metal component 100, and as a result the molecular bonding layers 40 are formed. Next, the resins 110$m$ and 120$m$ are applied to the surfaces of the molecular bonding layers 40 to form the resin layers 110 and 120. Through these processes, it is possible to produce the semiconductor package 10 according to the fourth embodiment.

The semiconductor packages 10 and the methods of manufacturing the semiconductor package 10 according to several embodiments are described above. However, the configuration of the semiconductor package 10 is not limited to the above example. For example, the lead frame 70 may not include the metal plating layer 72. That is, the entire lead frame 70 may be made of the metal 71$m$ (e.g., copper or a copper alloy) of the body 71. In this case, the metal 71$m$ is an example of a "second metal (i.e., a second metal material, or a second material)." That is, at least a part of the molecular bonding layer 40 may be chemically bonded (e.g., covalently bonded) to the metal 71$m$ included in the lead frame 70. According to such a configuration as well, it is possible to increase adhesiveness between the lead frame 70 and the resin mold 80. The "second metal" may be the same as or different from the "first metal."

In addition, from a different point of view, in the semiconductor package 10, the surface of the bonding wire 60 may not include the molecular bonding layer 40. A semiconductor package of one aspect includes a conductor, a molecular bonding layer, and a resin portion. The conductor includes a metal plating layer on a surface of the conductor. The molecular bonding layer is formed on a surface of the metal plating layer. The resin portion is bonded to the metal plating layer via the molecular bonding layer. At least a part of the molecular bonding layer is chemically bonded to a metal included in the metal plating layer. At least a part of the molecular bonding layer is chemically bonded to a resin included in the resin portion. That is, the semiconductor package 10 may include, for example, at least the molecular bonding layer 40 that is formed between the metal plating layer 72 and the resin mold 80. According to such a method of producing the semiconductor package 10, for example, before the bonding wire 60 is formed, the molecular bonding agent may be applied to the lead frame 70 alone. The molecular bonding layer 40 may be formed on the surface of the lead frame 70 in such a manner. After that, the bonding wire 60 may be connected to the lead frame 70 in which the molecular bonding layer 40 is formed.

According to at least one of the embodiments described above, it is possible to provide a semiconductor package with increased adhesiveness between a bonding wire and a resin mold using a molecular bonding layer.

In addition, from a different point of view, according to at least one of the embodiments described above, it is possible to provide a semiconductor package with increased adhesiveness between a metal plating layer and a resin portion using a molecular bonding layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device comprising:
a semiconductor chip having a terminal thereon;
a lead frame for connecting to an external device;
a bonding wire connecting the terminal and the lead frame;
a mold resin layer enclosing the semiconductor chip and the bonding wire, a portion of the lead frame extending out of the mold resin layer; and
a molecular bonding layer having a first portion on a surface of the bonding wire and having a first molecular portion covalently bonded to a material of the bonding wire and a material of the mold resin layer, and a second portion on a surface of the lead frame and having a second molecular portion covalently bonded to a material of the lead frame and the material of the mold resin layer,
wherein the lead frame comprises a metal plating layer on a main body thereof, and the second molecular portion is covalently bonded to a metal of the metal plating layer, and
wherein the molecular bonding layer includes a triazine derivative having a general formula:

where, in the general formula, R is one of a hydrocarbon group or a hydrocarbon group including at least one of a hetero atom or a functional group therein, X is a hydrogen atom or a hydrocarbon group, Y is an alkoxy group, and Z is one of a thiol group, an amino group, an azido group, any salt thereof, a hydrocarbon group, or a hydrocarbon group including at least one of a hetero atom or a functional group therein, n1 is an integer from 1 to 3, and n2 is equal to 1 or 2.

2. The semiconductor device according to claim 1, wherein
at least a portion of the molecular bonding layer is a monomolecular layer.

3. The semiconductor device according to claim 1, wherein
the molecular bonding layer is not formed on the portion of the lead frame that extends out of the mold resin layer.

4. The semiconductor device according to claim 1, wherein
a third portion of the molecular bonding layer is on a surface of the semiconductor chip and includes a third molecular portion covalently bonded to a material of the semiconductor chip and the material of the mold resin layer.

5. The semiconductor device according to claim 1, further comprising:
a base to which the semiconductor chip is bonded via a conductive bonding layer, wherein
a third portion of the molecular bonding layer is on a surface of the base and includes a third molecular portion covalently bonded to a material of the base and the material of the mold resin layer.

6. The semiconductor device according to claim 5, wherein
the molecular bonding layer covers exposed surfaces of the semiconductor chip and the base.

7. A semiconductor device comprising:
a semiconductor chip having a terminal thereon;
a lead frame for connecting to an external device;
a bonding wire connecting the terminal and the lead frame;
a mold resin layer enclosing the semiconductor chip and the bonding wire, a portion of the lead frame extending out of the mold resin layer; and
a molecular bonding layer having a first portion on a surface of the lead frame and including a first molecular portion covalently bonded to a material of the lead frame and a material of the mold resin layer,
wherein the lead frame comprises a metal plating layer on a main body thereof, and the first molecular portion is covalently bonded to a metal of the metal plating layer,
wherein the molecular bonding layer includes a triazine derivative having a general formula:

where, in the general formula, R is one of a hydrocarbon group or a hydrocarbon group including at least one of a hetero atom or a functional group therein, X is a hydrogen atom or a hydrocarbon group, Y is an alkoxy group, and Z is one of a thiol group, an amino group, an azido group, any salt thereof, a hydrocarbon group, or a hydrocarbon group including at least one of a hetero atom or a functional group therein, n1 is an integer from 1 to 3, and n2 is equal to 1 or 2.

8. The semiconductor device according to claim 7, wherein
at least a portion of the molecular bonding layer is a monomolecular layer.

9. The semiconductor device according to claim 7, wherein
the molecular bonding layer is not formed on the portion of the lead frame that extends out of the mold resin layer.

10. The semiconductor device according to claim 7, wherein
a second portion of the molecular bonding layer is on a surface of the semiconductor chip and includes a second molecular portion covalently bonded to a material of the semiconductor chip and the material of the mold resin layer.

11. The semiconductor device according to claim 7, further comprising:
a base to which the semiconductor chip is bonded via a conductive bonding layer, wherein
a second portion of the molecular bonding layer is on a surface of the base and includes a second molecular portion covalently bonded to a material of the base and the material of the mold resin layer.

12. A semiconductor device comprising:
a semiconductor chip having a terminal thereon;
a lead frame for connecting to an external device;
a bonding wire connecting the terminal and the lead frame;
a mold resin layer enclosing the semiconductor chip and the bonding wire, a portion of the lead frame extending out of the mold resin layer; and
a molecular bonding layer having a first portion on a surface of the bonding wire and having a first molecular portion covalently bonded to a material of the bonding wire and a material of the mold resin layer,
wherein the molecular bonding layer further includes portions respectively on a terminal of the semiconductor chip, the lead frame, and an exposed surface of the semiconductor chip, and the portions respectively include a second molecular portion covalently bonded to a material of the terminal of the semiconductor chip and the material of the mold resin layer, a third molecular portion covalently bonded to a material of the lead frame and the material of the mold resin layer, and a fourth molecular portion covalently bonded to a material of the semiconductor chip and the material of the mold resin layer.

13. A semiconductor device comprising:
a semiconductor chip having a terminal thereon;
a lead frame for connecting to an external device;
a bonding wire connecting the terminal and the lead frame;
a mold resin layer enclosing the semiconductor chip and the bonding wire, a portion of the lead frame extending out of the mold resin layer; and
a molecular bonding layer having a first portion on a surface of the lead frame and including a first molecular portion covalently bonded to a material of the lead frame and a material of the mold resin layer,
wherein the molecular bonding layer further includes portions respectively on a terminal of the semiconductor chip, an exposed surface of the semiconductor chip, and the bonding wire and the portions respectively include a second molecular portion covalently bonded to a material of the terminal of the semiconductor chip and the material of the mold resin layer, a third molecular portion covalently bonded to a material of the semiconductor chip and the material of the mold resin layer, and a fourth molecular portion covalently bonded to a material of the bonding wire and the material of the mold resin layer.

\* \* \* \* \*